US010959002B2

(12) United States Patent
Nishimura (10) Patent No.: US 10,959,002 B2
(45) Date of Patent: Mar. 23, 2021

(54) METHOD FOR OPERATING AN INTEGRATED MEMS MICROPHONE DEVICE AND INTEGRATED MEMS MICROPHONE DEVICE

(71) Applicant: ams AG, Premstaetten (AT)

(72) Inventor: Naoaki Nishimura, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/629,679

(22) PCT Filed: Jul. 3, 2018

(86) PCT No.: PCT/EP2018/067950
§ 371 (c)(1),
(2) Date: Jan. 9, 2020

(87) PCT Pub. No.: WO2019/011722
PCT Pub. Date: Jan. 17, 2019

(65) Prior Publication Data
US 2020/0275178 A1    Aug. 27, 2020

(30) Foreign Application Priority Data
Jul. 14, 2017   (EP) .................................. 17181409

(51) Int. Cl.
*H04R 1/08*    (2006.01)
*B81B 7/00*    (2006.01)
*H04R 1/02*    (2006.01)

(52) U.S. Cl.
CPC ............. *H04R 1/08* (2013.01); *B81B 7/0032* (2013.01); *B81B 7/0087* (2013.01);
(Continued)

(58) Field of Classification Search
CPC .... H04R 1/08; H04R 1/021; H04R 2201/003; B81B 7/0032; B81B 7/0087; B81B 7/0093; B81B 2201/0257
See application file for complete search history.

(56) References Cited

U.S. PATENT DOCUMENTS

2016/0100257 A1   4/2016  Nielsen et al.
2016/0249132 A1   8/2016  Oliaei
(Continued)

FOREIGN PATENT DOCUMENTS

CN   105848080 A   8/2016
CN   106878893 A   6/2017

OTHER PUBLICATIONS

European Patent Office, International Search Report for PCT/EP2018/067950 dated Sep. 13, 2018.
(Continued)

*Primary Examiner* — Andrew L Sniezek
(74) *Attorney, Agent, or Firm* — MH2 Technology Law Group LLP (57) ABSTRACT

A method for operating an integrated MEMS microphone device is proposed. The integrated MEMS microphone device comprises a package housing enclosing an interior cavity, wherein an integrated MEMS microphone die with a movable membrane, at least one environmental sensor and a thermal decoupling circuit are arranged inside the cavity. The method comprising the steps of repeatedly operating the environmental sensor in a measurement mode and activating the thermal decoupling circuit for a transition phase preceding and/or succeeding the measurement mode of the environmental sensor. During the transition phase a heat dissipation into the cavity is gradually adjusted.

16 Claims, 4 Drawing Sheets

(52) U.S. Cl.
CPC .......... *B81B 7/0093* (2013.01); *H04R 1/021* (2013.01); *B81B 2201/0257* (2013.01); *H04R 2201/003* (2013.01)

(56) References Cited

U.S. PATENT DOCUMENTS

| | | |
|---|---|---|
| 2016/0349056 A1 | 12/2016 | Thompson et al. |
| 2017/0164118 A1 | 6/2017 | Wiesbauer et al. |
| 2018/0246551 A1* | 8/2018 | Wiesbauer ........... H04R 19/005 |

OTHER PUBLICATIONS

Knobelspies, S. et al.: "Towards in-situ biogas sensing" Procedia Engineering vol. 120, Dec. 31, 2015, p. 269-274.
Chinese First Search Report in corresponding Chinese Application No. 201880046029X dated Nov. 9, 2020, 10 pages.

* cited by examiner

METHOD FOR OPERATING AN INTEGRATED MEMS MICROPHONE DEVICE AND INTEGRATED MEMS MICROPHONE DEVICE

CROSS-REFERENCE TO RELATED APPLICATIONS

The present application is the national stage entry of International Patent Application No. PCT/EP2018/067950, filed on Jul. 3, 2018, which claims the benefit of priority of European Patent Application No. 17181409.8, filed on Jul. 14, 2017, all of which are hereby incorporated by reference in their entirety for all purposes.

This invention relates to a method for operating an integrated MEMS microphone device and, further, to an integrated MEMS microphone device.

BACKGROUND OF THE INVENTION

Microelectromechanical systems, MEMS, microphones play a key role in many audio applications. MEMS microphones are highly integrated components using sophisticated package design and combine small size, high sound quality, reliability and affordability. Ongoing efforts in sensor technology seek to further integrate additional sensor concepts into single integrated MEMS microphone devices. For example, a MEMS microphone can be complemented with one or more environmental sensors, such as temperature, pressure, humidity, gas or air quality sensors. These sensors are not related to the audio function but exploit the same package as the MEMS microphone. The package has an open sound hole to the atmosphere which can be utilized to measure information from the atmosphere.

Figure 5:
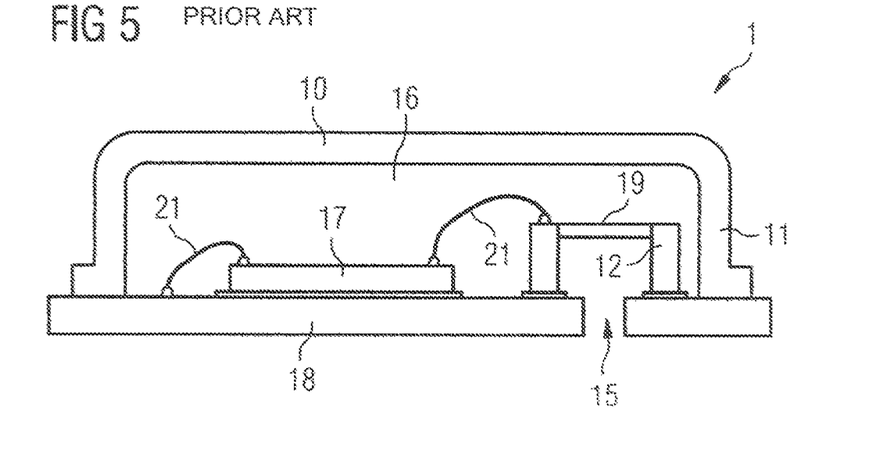
FIG. 5 shows an exemplary embodiment of an integrated microelectromechanical systems, MEMS, microphone device.

FIG. 5 shows an exemplary integrated MEMS microphone device. The MEMS microphone 1 comprises a package housing 10, a lid 11 and an integrated MEMS microphone die 12. The package housing 10 has a sound hole 15 which is arranged in and through the housing, leaving the housing open to its environment. An interior cavity 16 is defined by the lid 11 which is mounted to a substrate 18 of the package housing. The MEMS microphone die comprises a movable membrane 19, e.g. a MEMS diaphragm. An integrated circuit die 17 is arranged next to the integrated MEMS microphone die. The integrated circuit die and the integrated MEMS microphone die are electrically connected to each other and to the substrate 18 by means of wire bonds 21.

The movable membrane 19 is configured to receive sound from outside the package housing and through the sound hole. The movable membrane is responsive to pressure changes inside the interior cavity, which may originate from sound received from the outside via the sound hole or by interior sources, for example. Pressure changes can also be induced by a changing temperature inside the cavity, by means of heat dissipation into the cavity, for example.

Figure 6:
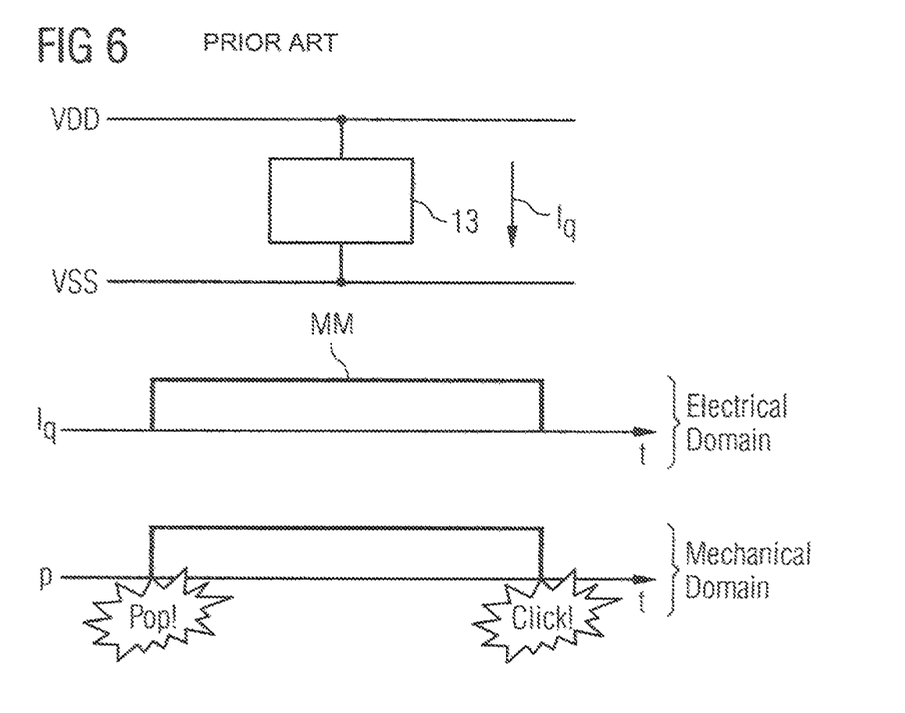
FIG. 6 shows an exemplary embodiment of a method to operate an integrated MEMS microphone device from the prior art.

FIG. 6 shows an operating scheme of an environmental sensor arranged in an integrated MEMS microphone device known in the art. The environmental sensor can be arranged inside the cavity. The sensor is connected to supply voltages VDD, VSS and is operated with an operating current Iq. The drawing is complemented with a timing diagram showing a measurement mode MM of the environmental sensor. Typically, the sensor is repeatedly enabled for the duration of the measurement mode. For example, the measurement mode is initiated every 1 s to 100 s for the duration of a few microseconds up to several milliseconds. The actual duration largely depends on the specific application. In fact, the duration can be a variable length. For example, a customer may wish to adjust an accuracy of the measurement depending on a specific situation. In such a case, duration could become variable. In some embodiments a longer duration can support accuracy.

Heat dissipation into the cavity can be caused by the environmental sensor. For example, when the measurement mode is initiated or terminated the sensor is essentially instantaneously switched on or off. This results in fast heating or cooling of the air which is present in the rather small back volume of the interior cavity, respectively. These changes in temperature lead to corresponding changes in pressure p or fast expansion of air in the cavity. Finally, these changes can induce an audible signal in the MEMS microphone. This audible signal may manifest itself as a "pop" or "click" noise even when the environmental sensor is electrically isolated from the audio functions because of the thermal coupling path just described. Thus, power consumption of an environmental sensor can modulate temperature inside the cavity.

An exemplary package housing has a length of 3.23 mm, a width of 1.90 mm and a height of 0.72 mm. This equals a back air volume V inside the cavity of about 1.09 mm$^3$. Assuming an ideal gas inside the cavity it follows:

$$\frac{p_2}{p_1} = \frac{T_2}{T_1} \Rightarrow \Delta T = \frac{\Delta p}{p} = 300 \text{ K} \cdot \frac{16 \text{ mPa}}{10^5 \text{ Pa}} = 48 \text{ }\mu\text{K},$$

wherein $p_1$, $T_1$ and $p_2$, $T_2$ denote the pressure and temperature inside the cavity before and after initiating or terminating the measurement mode, respectively. The induced temperature difference $\Delta T$ is expressed with respect to the atmospheric pressure p and the pressure difference $\Delta p$. In terms of energy this result can be expressed as:

$$E = \Delta T \cdot V \cdot \rho \cdot c_p =$$
$$48 \text{ }\mu\text{K} \cdot 1.09 \text{ mm}^3 \cdot 1.2041 \cdot 10^{-6} \frac{\text{g}}{\text{mm}^3} \cdot 1.005 \frac{\text{Ws}}{\text{gK}} = 63.31 \text{ pWs}.$$

Here $\rho$ and $c_p$ denote density and heat capacity at constant pressure. Thus, due to the small volume even a small change in temperature can result in an audible transient.

There have been attempts to in the art to make the pressure change $\Delta p$ as small as possible, e.g. by reducing power dissipation of additional circuits, such as environmental sensors, arranged in the cavity. Alternatively, such circuits have been kept on even if their function is not needed all the time. Both solutions have downsides. For example, reducing power typically also reduces circuit performance. Keeping the circuits on even if it is not needed increases the power consumption.

SUMMARY OF THE INVENTION

It is to be understood that any feature described hereinafter in relation to any one embodiment may be used alone, or in combination with other features described hereinafter, and may also be used in combination with one or more features of any other of the embodiments, or any combination of any other of the embodiments, unless explicitly described as an alternative. Furthermore, equivalents and modifications not described below may also be employed without departing from the scope of the method for operating the integrated MEMS microphone device and the integrated MEMS microphone device and as defined in the accompanying claims.

The following relates an improved concept for operating an integrated MEMS microphone device and, further, to an improved concept for an integrated MEMS microphone device.

The following relates an improved concept for a method for operating an integrated MEMS microphone device and, further, to an integrated MEMS microphone device implementing the method. The concept employs a thermal decoupling circuit to gradually adjust a heat dissipation into the cavity during a transition phase to reduce the effect of transients in an audio signal recorded by the integrated MEMS microphone. In fact, "click" or "pop" noise can be reduced or eliminated from the audio signal.

In at least one embodiment an integrated MEMS microphone device comprises a package housing which encloses an interior cavity. An integrated MEMS microphone die has a movable membrane and is arranged inside the interior cavity. Furthermore, at least one environmental sensor and a thermal decoupling circuit are arranged inside the cavity as well.

A method for operating an integrated MEMS microphone device comprises the following steps. The environmental sensor is repeatedly operated in a measurement mode. The thermal decoupling circuit is activated for a transition phase which precedes and/or succeeds the measurement mode of the environmental sensor. During the transition phase the thermal decoupling circuit gradually adjusts a heat dissipation into the cavity.

For example, the environmental sensor is embedded in a mobile device such as a smartphone, tablet or mobile computer. The environmental sensor may be enabled (or operated) in the measurement only at certain times. The measurement mode can be repeated in a fixed or adjustable time interval, such as once every second or once every 100 seconds, for example. In some embodiments the time interval may be different or can be set by a user on demand or set to any desired time period.

Typically, the environmental sensor is only enabled for a certain time, i.e. the measurement mode may be initiated and terminated at certain instants in time, respectively. Thus, there may be a transition phase preceding the measurement mode and there may be a transition phase succeeding the measurement mode. At least during one or both of these phases the thermal decoupling circuit is activated to gradually adjust heat dissipation into the interior cavity.

Heat dissipation is considered a thermal process in which some sort of energy is transformed into heat. For example, the thermal decoupling circuit is operated with a certain current. Electrical current flow through an electrical resistance can be subject to some degree of heat dissipation (Joule heating). Thus, the thermal decoupling circuit gradually adjusts a temperature inside the interior cavity during the transition phase(s). Typically, the heat dissipation leads to an increase of temperature inside the cavity which results in an increase of pressure as well. This increase may be high enough to be detected by means of the movable member of the integrated MEMS microphone die which then is translated into an audio signal. A sudden increase, however, may lead to an audible transient in the audio signal. Such a transient may resemble an unwanted "click" or "pop" noise in the audio signal.

Hereinafter, a transient is considered a high amplitude, short-duration sound at the beginning or end of a waveform in an audio signal. It may contain a higher degree of non-periodic components and a higher magnitude of high frequencies than the harmonic content than the rest of the audio signal. For example, a transient may be related to switching on or off an electrical current flow of a circuit arranged inside the interior cavity of the package housing. In fact, the comparably small dimensions of an integrated MEMS microphone device may suffice to induce audible transients as additional circuits, such as an environmental sensor arranged inside the cavity, are enabled or disabled in a measurement mode. For example, a pico-watt power change can be detected by a MEMS diaphragm and often results in an audible transient, such as a "click" or "pop" noise in the audio signal.

The proposed method, including gradually adjusting a heat dissipation into the cavity during the transition phase by means of the thermal decoupling circuit, reduces the effect of transients in the audio signal recorded by the integrated MEMS microphone. In fact, "click" or "pop" noise can be reduced or eliminated from the audio signal. Furthermore, the proposed concept allows for rather simple and small amount of additional circuitry to implement the method into an integrated MEMS microphone device. In some embodiments in may even be possible to use the environmental sensor itself or a part thereof as the thermal decoupling circuit. The proposed concept may not limit additional sensor functions or limit power consumption, for example of the environmental sensor.

Furthermore, the thermal decoupling circuit does not consume a lot of power as it may only be activated during the transition phase preceding or succeeding the measurement mode. For example, duration of the transition phases may be set to much shorter times than the measurement mode itself.

The term "repeatedly" denotes that the measurement mode can be enabled and repeated for a certain number of cycles or for an essentially endless loop. However, the term shall also comprise the situation wherein the measurement mode is executed only once, e.g. by user interaction. Typically the measurement mode is complemented with one transition phase preceding and another transition phase succeeding the start and end of the mode, respectively. The transition phase or transition phases may, however, overlap with the measurement mode in time. In some embodiments there may by a certain time period between an instance in time when a transition phase has been completed and an instance in time when the measurement mode is started or ended. In some embodiments, however, the transition phase starts or ends at the same instance in time when the measurement mode starts or ends, respectively.

In at least one embodiment, in the measurement mode, the environmental sensor is operated at an operating condition. The operating condition defines a first level of heat dissipation into the cavity. In the transition phase preceding the measurement mode, the heat dissipation is gradually adjusted to reach the first level. In addition, or alternatively, in the transition phase succeeding the measurement mode, the heat dissipation is adjusted to drop below the first level.

For example, the operating condition can be defined by a defined or constant electrical current flow associated with the thermal decoupling circuit. Due to the rather small dimensions of the integrated MEMS microphone device, a current flow will almost instantaneously dissipate heat into the cavity. Thus, the current will establish the first level of heat dissipation into the cavity. In the transition phase preceding the measurement mode, the current is gradually adjusted to reach the first level and/or in the transition phase succeeding the measurement mode the current is adjusted to drop below the first level, e.g. drop down to zero level.

In at least one embodiment the heat dissipation is adjusted depending on a transition function. The transition function is characterized by a characteristic time constant. For example, adjusting heat dissipation during the transition phase should not be too fast and should avoid occurrence of transients, especially audible transients. Thus, the characteristic time constant can be arranged such that the gradual adjustment of heat dissipation into the cavity is slow enough to avoid a transient in the audio signal, e.g. an audible transient in the audio signal. The transition function can be a continuous function of time, e.g. including an exponential function. However, the transition function may also be discontinuous, e.g. a step-function which is continuous only in a stepwise manner.

In at least one embodiment the transition function is arranged such that a pressure change due to gradually adjusting the heat dissipation inside the cavity induces a vibration frequency in the movable membrane. The induced vibration frequency may be inaudible to a human. For example, the vibration frequency is smaller than 50 Hz or is smaller than 20 Hz.

For example, a change of heat dissipation caused by enabling or disabling the measurement mode can modulate a temperature change and, hence, a pressure change inside the cavity. The pressure change induces a vibration frequency and can be detected by the movable member, e.g. a MEMS diaphragm, and results in an signal such as audible noise. Humans have less sense of hearing below 50 Hz and may not hear any sound below 20 Hz. Thus, transients like a "pop" or "click" sounds can be suppressed if the pressure change is slow enough, e.g. slower than 0.02 to 0.05 seconds. In many cases, environmental sensors and their associated control circuitry, e.g. temperature, humidity and air quality sensors, are often enabled once every second up to hundred seconds intervals. Additional wakeup time, such as 10 ms, can be negligible for those applications.

In at least one embodiment the transition function for the transition phase preceding the measurement mode increases as a function of time. In addition, or alternatively, the transition function for the transition phase succeeding the measurement mode decreases as a function of time.

In at least one embodiment the measurement mode is initiated by switching the environmental sensor on. In addition, or alternatively, the measurement mode is terminated by switching the environmental sensor off. Switching the measurement mode can be considered an essentially instantaneous process, i.e. there may essentially be zero rise time and zero fall time when initiating or terminating the measurement mode, respectively. Switching may be a source of generating audible transients due to the thermal coupling path present in MEMS microphone cavities.

In at least one embodiment the heat dissipation meets the first level when the measurement mode is initiated. Heat dissipation drops from the first level when the measurement mode is terminated.

In at least one embodiment the thermal decoupling circuit is switched on when the measurement mode is initiated. In addition, or alternatively, the thermal decoupling circuit is switched off when the measurement mode is terminated.

In at least one embodiment the thermal decoupling circuit comprises an adjustable current source or an adjustable current sink which are arranged to dissipate heat into the cavity. The current source or current sink provides a dissipation current, e.g. to establish an electrical current flow through the thermal decoupling circuit. Furthermore, the thermal decoupling circuit is separate from the environmental sensor. For example, the thermal decoupling circuit can be coupled to the environmental sensor.

The dissipation current of the thermal decoupling circuit is adjusted depending on the transition function. In the transition phase preceding the measurement mode, the dissipation current is adjusted until it meets an operating current. The operating current is defined by the operating condition of the measurement mode. In addition, or alternatively, in the transition phase succeeding the measurement mode the dissipation current is adjusted to drop from the operating current.

In at least one embodiment the thermal decoupling circuit is comprised by the environmental sensor and remains switched on in the measurement mode. For example, the thermal decoupling circuit and the environmental sensor are integrated into the same integrated circuit. In some embodiments the thermal decoupling circuit is part of the environmental sensor. Some environmental sensors allow their operating current to be adjusted gradually and, in a certain sense, then constitute the thermal decoupling circuit.

In at least one embodiment in the transition phase preceding the measurement mode, the operating current of the thermal decoupling circuit comprised by the environmental sensor is increased until the current reaches a value defined by the operating condition of the measurement mode. In addition, or alternatively, in the transition phase succeeding the measurement mode, the operating current is decreased until the environmental sensor is off. For example, the dissipation current equals the operating current.

In at least one embodiment an integrated MEMS microphone device comprises a package housing enclosing a cavity. An integrated MEMS microphone die is arranged inside the cavity. The MEMS microphone die comprises a movable membrane. At least one environmental sensor is arranged inside the cavity. The environmental sensor is configured to be operated in a measurement mode. The thermal decoupling circuit is arranged inside the cavity. The thermal decoupling circuit can be activated in a transition phase preceding and/or in a transition phase succeeding the measurement mode. The thermal decoupling circuit is configured to gradually dissipate power in the transition phase.

For example, the integrated MEMS microphone die comprises the movable membrane, e.g. a diaphragm, and further components such as amplifier(s), analog-to-digital converter (s), control logic and/or a microprocessor all integrated into the same die. However, a separate analog or digital integrated circuit die can be arranged inside the cavity or close to the MEMS microphone die, and can be used to process data from the MEMS microphone die, e.g. an application specific integrated circuit (ASIC). The environmental sensor may include additional circuitry for control and/or signal processing as well.

The proposed integrated MEMS microphone device, including the thermal decoupling circuit configured to gradually dissipate power in the transition phase, reduces the effect of transients in the audio signal to be recorded. In fact, "click" or "pop" noise can be reduced or eliminated from the audio signal. Furthermore, the proposed concept allows for rather simple and small amount of additional circuitry to be implemented into the integrated MEMS microphone device. In some embodiments in may even be possible to use the environmental sensor or a part thereof as the thermal decoupling circuit. The proposed concept may not limit additional sensor functions or limit power consumption, for example of the environmental sensor.

In at least one embodiment the thermal decoupling circuit is separate from the environmental sensor. The thermal decoupling circuit comprises at least one of: one or more adjustable current sources to dissipate heat into the cavity, one or more adjustable current sinks to dissipate heat into the cavity, one or more digitally adjustable analog-to-digital converters, or one or more digitally adjustable current analog-to-digital converters.

In at least one embodiment the thermal decoupling circuit is integrated into the integrated MEMS microphone die and/or into the environmental sensor.

In at least one embodiment the environmental sensor comprises at least one of a temperature sensor, a pressure sensor, a humidity sensor, and gas sensor and/or and have quality sensor.

Further embodiments of the method are readily derived from the various implementations and embodiments of the circuit arrangement and vice versa.

In the following, the principle presented above is described in further detail with respect to drawings, in which exemplary embodiments are presented.

In the exemplary embodiments and Figures below, similar or identical elements may each be provided with the same reference numerals. The elements illustrated in the drawings and their size relationships among one another, however, should not be regarded as true to scale. Rather individual elements, such as layers, components, and regions, may be exaggerated to enable better illustration or improved understanding.

DETAILED DESCRIPTION

Figure 1:
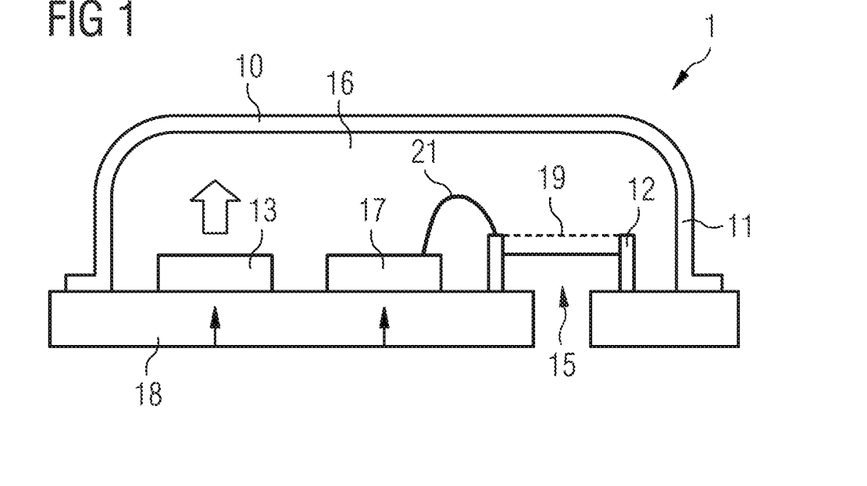
FIG. 1 shows an exemplary embodiment of an integrated microelectromechanical systems, MEMS, microphone device.

FIG. 1 shows an exemplary embodiment of an integrated microelectromechanical systems, MEMS, microphone device (MEMS microphone for short). The MEMS microphone device 1 comprises a package housing 10, a lid 11, an integrated MEMS microphone die 12, an integrated circuit die 17, at least one environmental sensor 13 and a thermal decoupling circuit 14.

The package housing 10 has a sound hole 15 which is arranged in and through the housing, leaving the housing open to its environment. For example, the sound hole communicates sound from outside the package housing to an interior of the package housing. In fact, an interior cavity 16 is defined by a lid 11 which is mounted to a substrate 18 of the package housing. The lid 11 encapsulated the interior of the package housing and thereby forms the interior cavity.

The integrated MEMS microphone die 12 is mounted on the substrate and resides inside the interior cavity. The MEMS microphone die comprises a movable membrane 19, e.g. a MEMS diaphragm. The movable membrane is configured to receive sound from outside the package housing through the sound hole. In fact, the movable membrane is responsive to pressure changes inside the interior cavity, which may originate from sound received from the outside via the sound hole or by interior sources, for example. Pressure can also be induced by changes in temperature inside the cavity.

The (analog or digital) integrated circuit die 17 is arranged inside the cavity next to the MEMS microphone die. The integrated circuit die 17 is arranged to process data from the MEMS microphone die, e.g. as an application specific integrated circuit (ASIC). For example, the integrated circuit die comprises control logic, analog-to-digital converters, a microprocessor, driver units and interfaces which are integrated into the same die. Alternatively some or all of these components can be arranged in the integrated MEMS microphone die to effect operation, control and processing of the MEMS microphone. Electrical connections 21, such as wire bond interconnects or through-silicon-vias, may be arranged between the integrated MEMS microphone die, the integrated circuit die and the substrate. The substrate comprises a printed circuit board, laminate, ceramic or lead frame, for example.

At least one environmental sensor 13 is mounted on the substrate and resides also inside the interior cavity. Environmental sensors include temperature sensors, pressure sensors, humidity sensors, gas sensors or air quality sensors, for example. Such sensors can be arranged inside the package housing in order to determine environmental parameters of the air or gas present inside the cavity, e.g. temperature, pressure, humidity, gas content or air quality. The environmental sensor can be complemented with additional circuitry to effect operation, control and pre-processing, for example. In fact, as will be discussed further with respect to FIG. 4 the thermal decoupling circuit may be comprised by the environmental sensor or its additional circuitry.

Figure 2:
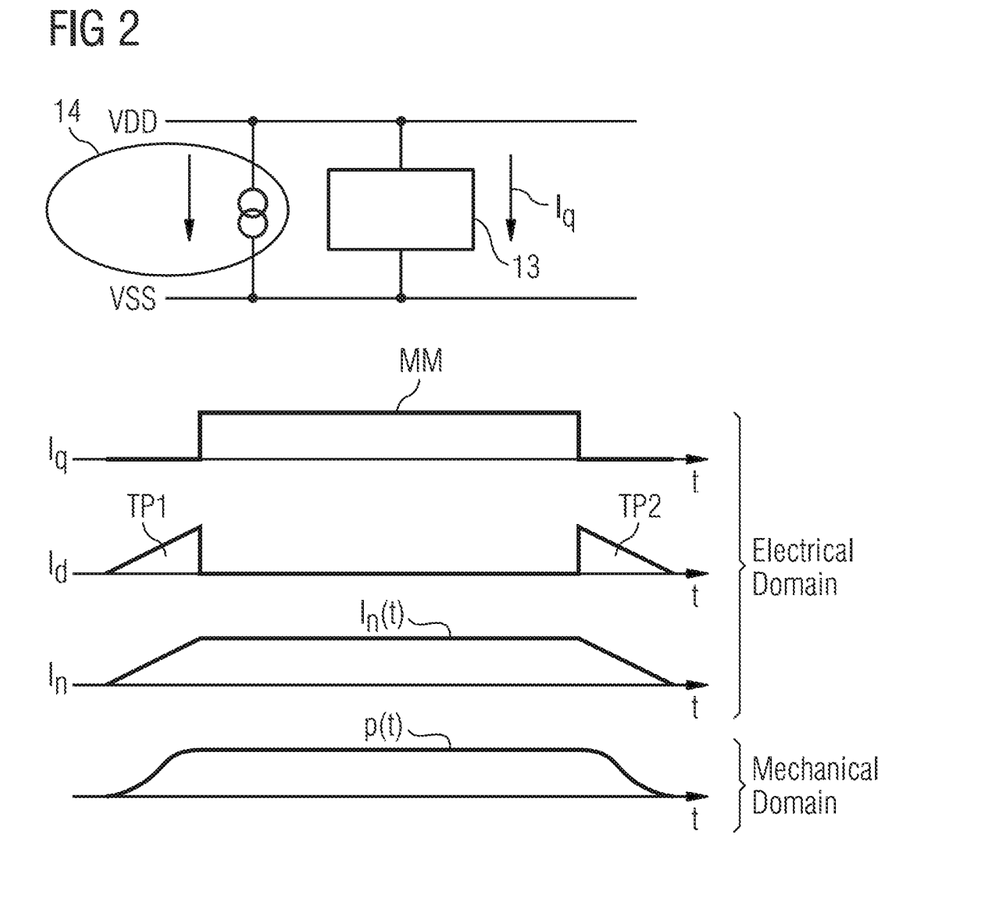
FIG. 2 shows an exemplary embodiment of a method to operate an integrated MEMS microphone device.

FIG. 2 shows an exemplary embodiment of a method to operate an integrated MEMS microphone device. Only the thermal decoupling circuit 14 and the environmental sensor 13 are shown for easier representation. In this example embodiment the thermal decoupling circuit is represented by an adjustable current source coupled to the supply voltages VDD, VSS. The environmental sensor is connected in parallel to the current source.

The environmental sensor is operated in a measurement mode MM. The measurement mode can be activated repeatedly and/or by user interaction, for example. In the measurement mode the environmental sensor is switched on for a certain duration and generates its characteristic sensor signal. In other words, the measurement mode is initiated by switching the environmental sensor on and the measurement mode is terminated by switching the environmental sensor off. For the duration of the measurement mode the environmental sensor is operated at an operating current Iq.

Initiating (switching on) and terminating (switching off) the measurement mode MM induce essentially instantaneous power transitions, respectively. For example, when the measurement mode is initiated, the environmental sensor is switched on from zero to reach the operating current Iq. When the measurement mode is terminated, the environmental sensor is switched off and the operating current Iq drops back to zero. These sudden changes induce respective temperature changes on a similar time scale. This is due to Joule heating caused by heat dissipation into the cavity due to the current flow associated with the environmental sensor, for example. As temperature equals particle movement in the cavity volume there is a thermal coupling path that causes a change in temperature to change pressure. The pressure change eventually actuates the movable membrane of the MEMS microphone. In other words there is a thermal coupling path between the electronic components and the air or gas arranged inside the cavity. Power consumption of the electronic components, for example, of the environmental sensor in measurement mode, modulates temperature, hence pressure, inside the package and may be detected by the MEMS microphone as audible signal or noise.

The thermal decoupling circuit 14, e.g. the adjustable current source in this embodiment, is activated for a first transition phase TP1 preceding initiating the measurement mode. The thermal decoupling circuit is activated again for a second transition phase TP2 succeeding terminating the measurement mode. During the first transition phase a dissipation current Id is gradually adjusted (increased) to reach the operating current Iq. In fact, the operating current Iq is met in the moment (or close to said moment) when the measurement mode is initiated and the first transition phase ends. Similarly, during the second transition phase the dissipation current Id is gradually adjusted (decreased) to drop from the operating current Iq. In fact, the dissipation current Id is decreased in the moment (or close to said moment) when the measurement mode is terminated. The second transition phase ends when the dissipation current Id reaches zero (or a constant) level.

The drawing depicts both the operating current Iq=Iq(t) and the dissipation current Id=Id(t) as functions of time t, respectively. On the scale of the cavity and considering both the environmental sensor and the thermal decoupling circuit as heaters, a net current In causes heat dissipation into the cavity volume. The net current constitutes a superposition of the operating current Iq and the dissipation current Id which is depicted in the drawing as a function In=In(t). The current functions introduced above are objects of the electric domain. The drawing also depicts a pressure function p(t) which is located in the mechanical domain. The pressure function shows how the heat dissipation caused by the net current In changes (or modulates) pressure inside the cavity.

The dissipation current Id=Id(t) can be considered a mathematical function (denoted transition function hereinafter) which can be characterized by a time constant and slope, for example. In this example embodiment the transition function is linear. The slope can be arranged such that the induced temperature and pressure changes are slow enough to induce an inaudible signal in the MEMS microphone.

This is to say that the induced pressure change due to adjusting the heat dissipation inside the cavity according to the transition function induces a vibration frequency in the movable membrane 19 which is inaudible to a human. Typically, a vibration frequency which is smaller than 50 Hz may not be sensed. A vibration frequency smaller than 20 Hz typically is not audible at all. In terms of characteristic time constant of the transient function, noise due to operation of the environmental sensor can be suppressed or even eliminated when a transient of the induced pressure change is slower than about 0.02 to 0.05 seconds.

Figure 3A:
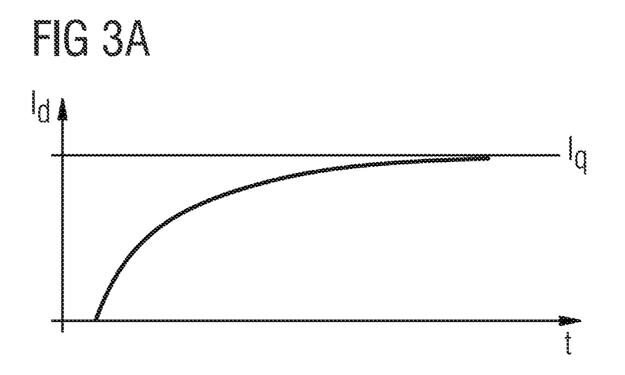
FIGS. 3A to 3C show examples of transient functions and an exemplary embodiment of a thermal decoupling circuit.
Figure 3B:
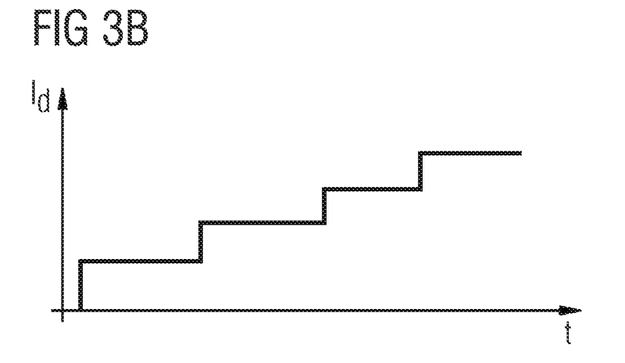
Figure 3C:
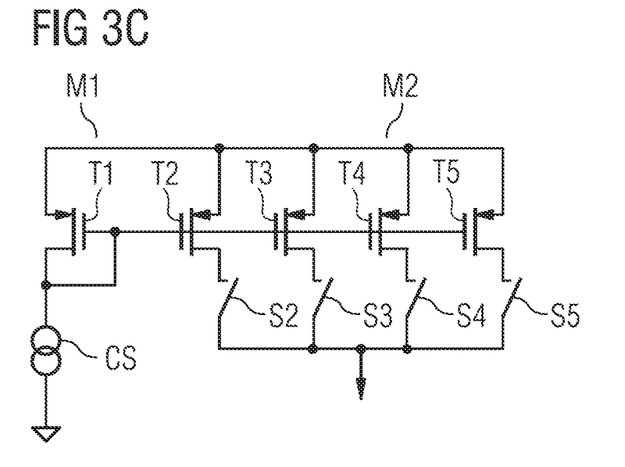

FIGS. 3A to 3C show examples of transient functions and an exemplary embodiment of a thermal decoupling circuit. As discussed above the dissipation current Id is gradually adjusted according to a transient function. Thus, heat dissipation into the cavity depends on the transition function as well.

The transition function can be characterized by a characteristic time constant. For example, adjusting heat dissipation during the transition phase TP1, TP2 should not be too fast and should avoid occurrence of transients, especially audible transients. Thus, the characteristic time constant can be arranged such that the gradual adjustment of heat dissipation into the cavity is slow enough to avoid a transient in the audio signal, e.g. an audible transient in the audio signal. For example, the time constant determines that the induced pressure change is slower than about 0.02 to 0.05 seconds.

FIG. 3A shows a transition function which is a continuous function of time, e.g. including an exponential function. Depending on the chosen time constant, the transition function has a steeper slope at the beginning of the transition phase and evens out the closer it comes to initiating the measurement mode, i.e. towards reaching the level of the operating current Iq. Such a transient function can be implemented by an adjustable transistor or diode based current source (or current sink) as thermal decoupling circuit, for example. Another example includes a RC circuit characterized by the characteristic time constant.

FIG. 3B shows a transition function which is a discontinuous function of time. This exemplary function is continuous only in a stepwise manner. However, the time scale may resemble the time constant of FIG. 3A to determine that the induced pressure change is slow enough, e.g. slower than about 0.02 to 0.05 seconds. Such a stepwise transition function can be implemented by a current analog-to-digital converter as the one depicted in FIG. 3C, for example. The current analog-to-digital converter comprises a current mirror having a first and a second branch M1, M2. A current source CS connected to a transistor T1 is located in the first branch and mirrors a current into the second branch. The second branch comprises a number of diode-connected transistors T2, T3, T4, T5 which are connected in parallel via respective switches S2, S3, S4, S5. The switches can be utilized to connect the transistors one after the other. Depending on the number of transistors actively connected together the current analog-to-digital converter outputs a current which ramps up in steps depending on the number of transistors connected. The individual transistors constitute current sources of their own.

The transition functions shown in FIGS. 3A and 3B can be applied during the transition phase TP1 preceding the measurement mode, for example. Inverse functions can be applied during the transition phase TP2 succeeding the measurement mode, for example. The transition functions and their implementation may also be applied to the method discussed in FIG. 4.

Figure 4:
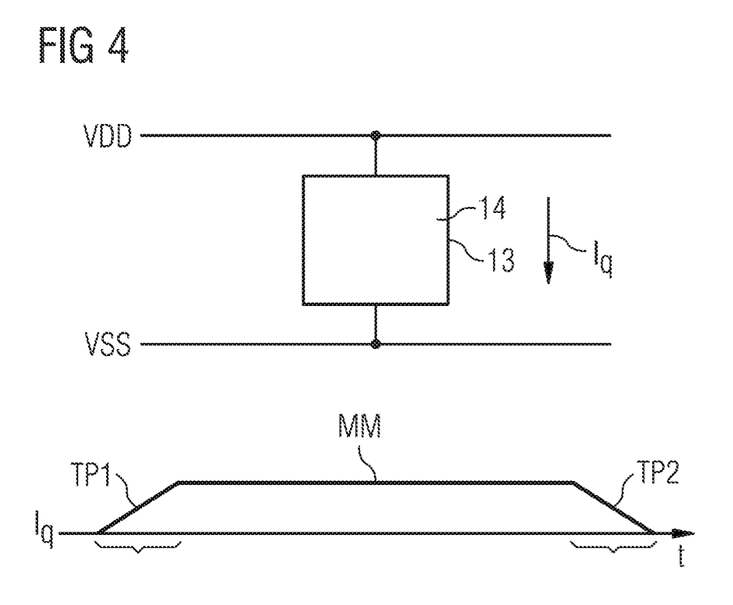
FIG. 4 shows an exemplary embodiment of a method to operate an integrated MEMS microphone device.

FIG. 4 shows an exemplary embodiment of a method to operate an integrated MEMS microphone device. In fact, the integrated MEMS microphone device can be the same as the one discussed with respect to FIG. 1. However, instead the thermal decoupling circuit 14 is comprised by the environmental sensor or by parts of its circuitry. Thus, the environmental sensor, or parts thereof, function as thermal decoupling circuit as well.

In order to implement the thermal decoupling functionality the environmental sensor is operated with an operating current changing in time Iq=Ig(t). In fact, the function Iq(t) can be considered a superposition of a first transition phase TP1 during which the operating current gradually increases, an essentially constant operating current at an operating level (similar to FIG. 2) and a second transition phase TP2 during which the operating current gradually decreases, e.g. back to a zero level. The operating current, considered as a function of time, may have the shape of the net current In(t)

shown in FIG. 2, as the transition phases in operating current take over the role of the dissipation current Id of FIG. 2.

The invention claimed is:

1. A method for operating an integrated MEMS (Microelectromechanical systems) microphone device comprising a package housing enclosing an interior cavity, wherein an integrated MEMS microphone die with a movable membrane, at least one environmental sensor and a thermal decoupling circuit are arranged inside the cavity, the method comprising:
repeatedly operating the environmental sensor in a measurement mode;
activating the thermal decoupling circuit for a transition phase preceding and/or succeeding the measurement mode of the environmental sensor; and
during the transition phase, gradually adjusting a heat dissipation into the cavity, wherein the heat dissipation is adjusted by the thermal decoupling circuit depending on a transition function with a characteristic time constant.

2. The method according to claim 1, wherein
in the measurement mode, the environmental sensor is operated at an operating condition defining a first level of heat dissipation into the cavity; and wherein:
in the transition phase preceding the measurement mode, the heat dissipation is gradually adjusted to reach the first level, and/or
in the transition phase succeeding the measurement mode, the heat dissipation is adjusted to drop below the first level.

3. The method according to claim 1, wherein the transition function is arranged such that a pressure change due to adjusting the heat dissipation inside the cavity induces a vibration frequency in the movable membrane which is inaudible to a human, for example, a vibration frequency which is smaller than 50 Hz or which is smaller than 20 Hz.

4. The method according to claim 1, wherein
the transition function for the transition phase preceding the measurement mode increases as a function of time, and/or
the transition function for the transition phase succeeding the measurement mode decreases as a function of time.

5. The method according to claim 1, wherein
the measurement mode is initiated by switching the environmental sensor on, and/or
the measurement mode is terminated by switching the environmental sensor off.

6. The method according to claim 5, wherein
heat dissipation meets the first level when the measurement mode is initiated, and/or
heat dissipation drops from the first level when the measurement mode is terminated.

7. The method according to claim 5, wherein
the thermal decoupling circuit is switched on when the measurement mode is initiated, and/or
the thermal decoupling circuit is switched off when the measurement mode is terminated.

8. The method according to claim 6, wherein the thermal decoupling circuit comprises an adjustable current source or an adjustable current sink to dissipate heat into the cavity and the thermal decoupling circuit is separate from the environmental sensor, and wherein:
a dissipation current of the thermal decoupling circuit is adjusted depending on the transition function, and wherein
in the transition phase preceding the measurement mode, the dissipation current is adjusted until it meets an operating current, wherein the operating current is defined by the operating condition of the measurement mode, and/or
in the transition phase succeeding the measurement mode, the dissipation current is adjusted to drop from operating current.

9. The method according to claim 5, wherein the thermal decoupling circuit is comprised by the environmental sensor and remains switched on in the measurement mode.

10. The method according to claim 9, wherein
in the transition phase preceding the measurement mode, an operating current is increased until the operating current reaches a value defined by the operating condition of the measurement mode, and/or
in the transition phase succeeding the measurement mode, the operating current is decreased until the environmental sensor is off.

11. An integrated MEMS (Microelectromechanical systems) microphone device, comprising:
a package housing enclosing a cavity;
an integrated MEMS microphone die arranged inside the cavity, wherein the MEMS microphone die comprises a movable membrane;
at least one environmental sensor arranged inside the cavity, wherein the environmental sensor is configured to be activated in a measurement mode; and
a thermal decoupling circuit arranged inside the cavity, wherein the thermal decoupling circuit can be activated in a transition phase preceding and/or succeeding the measurement mode, and wherein the thermal decoupling circuit is configured to gradually dissipate power in the transition phase depending on a transition function with a characteristic time constant.

12. The device according to claim 11, wherein the thermal decoupling circuit is separate from the environmental sensor and comprises at least one of:
one or more adjustable current sources to dissipate heat into the cavity,
one or more adjustable current sinks to dissipate heat into the cavity,
one or more a digitally adjustable analog-to-digital converters
one or more a digitally adjustable current analog-to-converters.

13. The device according to claim 11, wherein the thermal decoupling circuit is integrated into the integrated MEMS (Microelectromechanical systems) microphone die and/or the environmental sensor.

14. The device according to claim 11, wherein the environmental sensor comprising at least one of:
a temperature sensor,
a pressure sensor,
a humidity sensor,
a gas sensor and/or
an air quality sensor.

15. A method for operating an integrated MEMS (Microelectromechanical systems) microphone device comprising a package housing enclosing an interior cavity, wherein an integrated MEMS microphone die with a movable membrane, at least one environmental sensor and a thermal decoupling circuit are arranged inside the cavity, the method comprising:
repeatedly operating the environmental sensor in a measurement mode;
activating the thermal decoupling circuit for a transition phase preceding and/or succeeding the measurement mode of the environmental sensor; and during the transition phase, gradually adjusting of temperature inside the cavity due to the flow of electrical current through the thermal decoupling circuit; wherein:
  the measurement mode is initiated by switching the environmental sensor on, and/or
  the measurement mode is terminated by switching the environmental sensor off,
  heat dissipation due to the flow of electrical current through the thermal decoupling circuit meets a first level when the measurement mode is initiated, and/or
  heat dissipation drops from the first level when the measurement mode is terminated, and
  the thermal decoupling circuit comprises an adjustable current source or an adjustable current sink to dissipate heat into the cavity and the thermal decoupling circuit is separate from the environmental sensor, and wherein:
  a dissipation current of the thermal decoupling circuit is adjusted depending on a transition function with a characteristic time constant, and wherein
  in the transition phase preceding the measurement mode, the dissipation current is adjusted until it meets an operating current, wherein the operating current is defined by the operating condition of the measurement mode, and/or
  in the transition phase succeeding the measurement mode, the dissipation current is adjusted to drop from operating current.

16. An integrated MEMS (Microelectromechanical systems) microphone device, comprising:
  a package housing enclosing a cavity;
  an integrated MEMS microphone die arranged inside the cavity, wherein the MEMS microphone die comprises a movable membrane;
  at least one environmental sensor arranged inside the cavity, wherein the environmental sensor is configured to be activated in a measurement mode; and
  a thermal decoupling circuit arranged inside the cavity, wherein the thermal decoupling circuit can be activated in a transition phase preceding and/or succeeding the measurement mode, and wherein the thermal decoupling circuit is configured to gradually adjust, in the transition phase, the temperature inside the cavity due to the flow of electrical current through the thermal decoupling circuit,
  the thermal decoupling circuit comprises an adjustable current source or an adjustable current sink to dissipate heat into the cavity and the thermal decoupling circuit is separate from the environmental sensor; and
wherein the device is operable to:
repeatedly operate the environmental sensor in a measurement mode;
activate the thermal decoupling circuit for a transition phase preceding and/or succeeding the measurement mode of the environmental sensor; and
during the transition phase, gradually adjust a heat dissipation into the cavity; wherein:
  the measurement mode is initiated by switching the environmental sensor on, and/or
  the measurement mode is terminated by switching the environmental sensor off,
  heat dissipation meets a first level when the measurement mode is initiated, and/or
  heat dissipation drops from the first level when the measurement mode is terminated, and
  a dissipation current of the thermal decoupling circuit is adjusted depending on a transition function with a characteristic time constant, and wherein
  in the transition phase preceding the measurement mode, the dissipation current is adjusted until it meets an operating current, wherein the operating current is defined by the operating condition of the measurement mode, and/or
  in the transition phase succeeding the measurement mode, the dissipation current is adjusted to drop from operating current.

* * * * *